United States Patent
Dickey et al.

(10) Patent No.: US 9,928,143 B2
(45) Date of Patent: Mar. 27, 2018

(54) SYSTEM AND METHOD FOR MANAGING SINGLE EVENT LATCHED (SEL) CONDITIONS

(71) Applicant: Hamilton Sundstrand Corporation, Charlotte, NC (US)

(72) Inventors: John A. Dickey, Caledonia, IL (US); Michael J. Hanson, Rockford, IL (US); Daniel Knope, Loves Park, IL (US); Matt Earing, DeKalb, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 99 days.

(21) Appl. No.: 15/134,047

(22) Filed: Apr. 20, 2016

(65) Prior Publication Data

US 2017/0308441 A1    Oct. 26, 2017

(51) Int. Cl.
| | |
|---|---|
| *G06F 11/00* | (2006.01) |
| *G06F 11/14* | (2006.01) |
| *G06F 9/44* | (2018.01) |
| *G06F 1/32* | (2006.01) |

(52) U.S. Cl.
CPC ........ *G06F 11/1441* (2013.01); *G06F 1/3234* (2013.01); *G06F 9/4418* (2013.01); *G06F 2201/805* (2013.01); *G06F 2201/85* (2013.01)

(58) Field of Classification Search
CPC ............. H03K 19/0033; G06F 11/0757; G06F 11/0793; G06F 11/1008; G06F 11/1048; G06F 11/1441; H01L 23/552; H02H 5/005; H04B 7/18515
See application file for complete search history.

(56) References Cited

U.S. PATENT DOCUMENTS

| | | |
|---|---|---|
| 4,618,953 A | 10/1986 | Daniels et al. |
| 5,590,280 A | 12/1996 | Watanabe |
| 5,864,663 A | 1/1999 | Stolan |
| 6,064,555 A | 5/2000 | Czajkowski et al. |
| 6,738,934 B2 | 5/2004 | Frank et al. |
| 6,985,343 B2 | 1/2006 | Mirowski et al. |
| 7,907,378 B2 | 3/2011 | Julicher |
| 8,117,512 B2 | 2/2012 | Sorensen et al. |
| 9,274,895 B1 | 3/2016 | Wojahn |

(Continued)

FOREIGN PATENT DOCUMENTS

| | | | |
|---|---|---|---|
| JP | 2003067220 A | * | 3/2003 |
| JP | 20030067220 | | 3/2003 |

OTHER PUBLICATIONS

Machine Translation of JP 2003-067220, dated Mar. 7, 2003.*

(Continued)

*Primary Examiner* — Michael Maskulinski
(74) *Attorney, Agent, or Firm* — Locke Lord LLP; Scott D. Wofsy; Judy R. Naamat (57) ABSTRACT

A system and method to manage a single event latched (SEL) condition, the method including operations to monitor, for a predetermined condition associated with single event latched (SEL) states, a reset signal output from a watchdog device to a microprocessor, wherein the reset signal is responsive to a malfunction condition associated with the microprocessor. The method further includes operations to control provision of power to the microprocessor in response to detection of the predetermined condition.

14 Claims, 4 Drawing Sheets

(56) References Cited

U.S. PATENT DOCUMENTS

2015/0370274 A1 12/2015 Wilberg et al.
2017/0033554 A1* 2/2017 Vail ........................ H02H 3/087

OTHER PUBLICATIONS

LaBel et al., "Single-Event-Effect Mitigation from a System Perspective", Apr. 1996, IEEE Transactions on Nuclear Science, vol. 43, No. 2, pp. 654-660.*

Maurer, R.H., et al., "Single Event Upset and Latchup Sensitive Devices in Satellite Systems," The Johns Hopkins University Applied Physics Laboratory, Laurel, MD 20723-6099.

Extended European Search Report for European Patent Application No. 17166120.0, dated Aug. 21, 2017.

Label, Kenneth A., et al.: "Single-Event-Effect Mitigation from a System Perspective", IEEE Transactions on Nuclear Science, IEEE Service Center, New York, NY, US, vol. 43, No. 2, Apr. 1, 1996 (Apr. 1, 1996), XP011040316, ISSN: 0018-9499, abstract * section "I. Introduction", "II. Functional Impact of an SEE"; pp. 654 & 655; figure 1 *, section "C. Mitigation of Control-Related Devices", "D. Treatment of Destructive Conditions and Mitigation", "F. Sample Method of Realistic SEE Risks and Usage"; pp. 657-660*.

* cited by examiner

Fig. 4 ated with the microprocessor and resuming functional operation. The present disclosure provides a solution for these problems.

SYSTEM AND METHOD FOR MANAGING SINGLE EVENT LATCHED (SEL) CONDITIONS

FIELD OF THE INVENTION

The present technology relates to a control circuit, and more particularly, methods and systems for managing single event latched (SEL) conditions.

BACKGROUND OF THE INVENTION

A watchdog circuit is used to monitor operation of a microprocessor and to reset the microprocessor in the event of a malfunction condition of the microprocessor. Upon detection of the malfunction condition, the watchdog circuit outputs a reset signal to the microprocessor that causes the microprocessor to be reset. The reset operation is intended to return the microprocessor to a known reference state after which the microprocessor resumes operation.

The malfunction condition is typically a result of, though not limited to, any of three causes. The first cause is external electromagnetic interference (EMI), which can cause the power being supplied to the microprocessor to fluctuate, which in turn can cause the microprocessor to operate unpredictably. The second cause, external radiation, such as that found in the atmosphere or outer space, can cause single event effect (SEE) that can also result in erratic operations by the microprocessor. The third cause is unanticipated software errors. Many causes of malfunction conditions can often be cleared by triggering a reset operation of the microprocessor, however, this may not be sufficient to clear certain malfunction conditions.

Single Event Effects (SEEs) are caused by a single, energetic particle. SEEs can be based on soft errors or hard errors. Soft errors can include, for example, a Single Event Upset (SEU), which is usually non-destructive and can be cleared by a reset pulse to the microprocessor. An SEU can appear as s transient pulse in logic or support circuitry, or as a bitflip in a memory cell or register. A hard error can include, for example, a Single Event Latchup (SEL), burnout of power components (e.g., MOSFETS), gate rupture, frozen bits, and noise in CCDs. An SEL that causes a high operating current that exceeds device specifications is potentially destructive. In situations, an SEL can only be cleared by restarting power to the microprocessor, including removing and then restoring power. A reset operation of the microprocessor would not be sufficient.

The watchdog circuit can detect a malfunction condition of the microprocessor, and in response trigger a reset operation of the microprocessor by sending a reset pulse. However, the malfunction condition may still persist, such as when the malfunction condition was caused by an SEL or other hard error. In response to a persistent malfunction condition, the watchdog circuit may hold the reset signal in a persistent actuated state, e.g., by holding the reset signal to a continuous or repeated reset level. The microprocessor is thus maintained in a nonfunctional continuous reset state until maintenance of the hardware is performed.

Such conventional methods and systems have generally been considered satisfactory for their intended purpose. However, there is still a need in the art for responding to malfunction conditions associated with peripheral devices or input/output devices that are coupled to the microprocessor. Additionally, there is still a need in the art for clearing persistent malfunction conditions of the microprocessor or devices coupled to the microprocessor and resuming functional operation. The present disclosure provides a solution for these problems.

SUMMARY OF THE INVENTION

The purpose and advantages of the below described illustrated embodiments will be set forth in and apparent from the description that follows. Additional advantages of the illustrated embodiments will be realized and attained by the devices, systems and methods particularly pointed out in the written description and claims hereof, as well as from the appended drawings.

To achieve these and other advantages and in accordance with the purpose of the illustrated embodiments, in one aspect, disclosed is a method to manage a single event latched (SEL) condition, wherein the method includes operations to monitor, for a predetermined condition associated with single event latched (SEL) states, a reset signal output from a watchdog device to a microprocessor, wherein the reset signal is responsive to a malfunction condition associated with the microprocessor. The method further includes operations to control provision of power to the microprocessor in response to detection of the predetermined condition.

In embodiments, the malfunction condition associated with the microprocessor can be caused by an SEL condition associated with the microprocessor. The predetermined condition can be determined based on persistent enablement of the reset signal.

Additionally, in embodiments, the malfunction condition associated with the microprocessor; is caused by an SEL condition that affects a device that is coupled to the microprocessor, wherein the device is coupled to the microprocessor and receiving power to operate from the power provided.

In embodiments, controlling the provision of power includes triggering a power supply restart that removes power supplied to the microprocessor or the microprocessor and the device, the power being subsequently automatically restored to the microprocessor or the microprocessor and the device.

Additionally, in embodiments, the method further includes operations to count a number of times that a power restart is triggered, and suppress triggering a power supply restart in response to the number of times counted exceeding a threshold value. The method can further include operations to enable an indicator signal to indicate that the number of times counted exceeded a threshold value.

In addition, aspects of the disclosure are directed to a monitor system that is configured to perform the method of the disclosure.

In addition, aspects of the disclosure are directed to a power delivery system that includes a power supply for supplying power from the power supply to electronic processing circuits susceptible to single event latched (SEL). The computing device is configured to monitor, for a predetermined condition associated with SEL states, a reset signal output from a watchdog device to the electronic processing circuits. The reset signal is responsive to a malfunction condition associated with the electronic processing circuits. The computing device is further configured to control provision of power by the power supply to the electronic processing circuits in response to detection of the predetermined condition.

In embodiments, the malfunction condition associated with the microprocessor is caused by an SEL condition associated with the microprocessor. Furthermore, in embodiments, the predetermined condition is determined based on persistent enablement of the reset signal. Additionally, in embodiments, the power delivery system further includes a power supply bus. The power supply provides power to the power supply bus, and the microprocessor and device receive power from the power supply via the power supply bus. The computing device controls the power supply to discontinue providing power to the power supply bus. In addition, in embodiments, the instructions, when executed by the processing device, cause the processing device to count a number of times that a power supply restart is triggered, and suppress triggering a power supply restart in response to the number of times counted exceeding a threshold value.

BRIEF DESCRIPTION OF THE DRAWINGS

The accompanying appendices and/or drawings illustrate various non limiting, example, inventive aspects in accordance with the present disclosure.

DETAILED DESCRIPTION OF CERTAIN EMBODIMENTS

Figure 1:
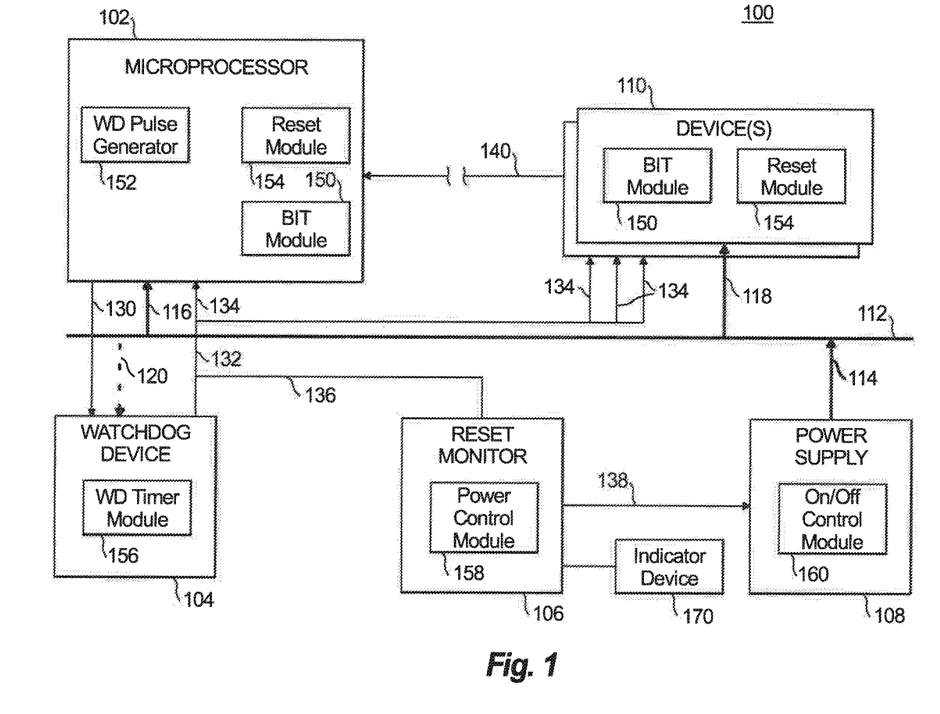
FIG. 1 illustrates a block diagram of an example monitor system in accordance with an aspect of the disclosure.

Reference will now be made to the drawings wherein like reference numerals identify similar structural features or aspects of the subject disclosure. For purposes of explanation and illustration, and not limitation, a block diagram of an exemplary embodiment of a monitoring system in accordance with the disclosure is shown in FIG. 1 and is designated generally by reference character 100. Other embodiments of the monitoring system 100 in accordance with the disclosure, or aspects thereof, are provided in FIGS. 2-4, as will be described. The systems and methods described herein can be used to provide improved detection of and responses to malfunction conditions, for example in aerospace or aeronautical applications.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, exemplary methods and materials are now described.

It must be noted that as used herein and in the appended claims, the singular forms "a", "an," and "the" include plural referents unless the context clearly dictates otherwise. Thus, for example, reference to "a stimulus" includes a plurality of such stimuli and reference to "the signal" includes reference to one or more signals and equivalents thereof known to those skilled in the art, and so forth. It is to be appreciated the embodiments of this disclosure as discussed below are implemented using a software algorithm, program, or code that can reside on a computer useable medium for enabling execution on a machine having a computer processor. The machine can include memory storage configured to provide output from execution of the computer algorithm or program.

As used herein, the term "software" is meant to be synonymous with any logic, code, or program that can be executed by a processor of a host computer, regardless of whether the implementation is in hardware, firmware or as a software computer product available on a disc, a memory storage device, or for download from a remote machine. The embodiments described herein include such software to implement the equations, relationships, and algorithms described below. One skilled in the art will appreciate further features and advantages of the disclosure based on the embodiments described below. Accordingly, the disclosure is not to be limited by what has been particularly shown and described, except as indicated by the appended claims.

Description of certain illustrated embodiments of the present disclosure will now be provided. With reference now to FIG. 1, monitor system 100 includes a microprocessor 102, a watchdog device 104, a reset monitor 106, and a power supply 108. The monitor system 100 can optionally include one or more devices 110, e.g., I/O and/or peripheral devices (such as memory, communications devices or a keyboard, sensor display device, or touchscreen) that are coupled to the microprocessor 102. The power supply 108 provides power to a power bus 112 via conductor 114, and the power bus 112 provides power to the microprocessor 102 and the devices 110 via conductors 116 and 118, respectively. An individual conductor 118 can be coupled between respective devices 110 to provide power to each respective device 110.

The reset monitor 106, including the power control module 158, can be provided with power by a power supply (not shown) that is independent of power supply 108. Accordingly, the reset monitor 106 can receive power and be operated even when the power supply 108 has been controlled to remove power from the power bus 112. The reset monitor 106 can consume a very small amount of power, which can be supplied by a simple power supply regulator circuit that is separate from the power supply 108.

Optionally, conductor 120 can be coupled between the power bus 112 and the watchdog device 104 for providing power. Alternatively, the watchdog device 104 can receive power from alternate sources, such as one or more batteries or another power source. The microprocessor 102 monitors the devices 110, and the watchdog device 104 monitors the microprocessor 102. The microprocessor 102 provides watchdog pulses via link 130 to the watchdog device 104. The watchdog device 104 provides a reset signal via links 132 and 134 to the microprocessor 102 and/or the devices 110.

The reset monitor 106 monitors the reset signal via a link 136 that couples between link 132 and the reset monitor 106. The reset signal is monitored for a predetermined condition that indicates detection of a malfunction condition, such as a hard error or SEL condition that would need removal of power from the microprocessor 102 and/or the devices 110 in order to be resolved. In response to detection of the predetermined condition, the reset monitor 106 transmits a power control signal via link 138 to the power supply 108 to remove power delivered to the microprocessor 102 and the devices 110, e.g., by removing power from the power bus 112. The power supply 108 continues to remove power for a sufficient amount of time for the malfunction condition to be rectified, after which the power supply restores power to the microprocessor 102 and the devices 110. Additionally, the power control signal can control removal of power from the watchdog device 104 and/or the reset monitor 106 when the watchdog device 104 is coupled to the power bus 112 for receiving power from the power bus 112.

The microprocessor 102 and devices 110 can each include a processing device that includes a processing unit. In embodiments, the processing device can further include a memory, and/or one or more interfaces for exchanging data with an input and/or output device and/or for communicating with the other processing devices. In embodiments, the processing unit is capable of executing software that may be stored by the memory, The processing device can include, for example, hardware, firmware, a microprocessor, a microcontroller, an application specific integrated circuit (ASIC), a field programmable gate array (FPGA), logic components, solid-state components, and/or analog components.

The watchdog device 104, reset monitor 106, and the power supply 108 can also include one or more processing devices, including supporting hardware/firmware, wherein these processing devices are not shared with, but are independent from, the microprocessor 102 and the devices 110. In embodiments, the processing devices are configured to execute software instructions. A portion or all of the one or more processing devices and supporting hardware/firmware can be shared between the watchdog device 104, reset monitor 106, and/or power supply 108. In embodiments, a single processing device and/or supporting hardware/firmware is shared by the reset monitor 106 and power supply 108. In embodiments, one or more of the watchdog device 104, reset monitor 106, and power supply 108 operate using a processing device that does not execute software, but rather uses hardware and/or firmware to process and output signals, such as an FPGA, an ASIC, analog devices, and/or logic circuits.

Regarding software modules, the processing devices described above can execute software instructions to implement the functions of the disclosure as described. In embodiments, the software instructions can be stored in a computer-readable medium and/or implemented as firmware or logic circuits. The devices 110 and/or microprocessor 102 can include respective built-in-test (BIT) software modules 150. The microprocessor 102 can include a watchdog (WD) pulse generator software module 152.

The functionality of the watchdog device 104, reset monitor 106, and power supply 108 can be implemented using watchdog timer module 156, power control module 158, and ON/OFF control module 160, respectively. Each of these modules can be implemented using hardware, firmware, and/or software.

In embodiments, the reset monitor 106 is a standalone device that is not integrated into the watchdog device 104 or the power supply 108. In other embodiments, the reset monitor 106 is integrated, completely or partially, into at least one of the watchdog device 104 and power supply 108. The reset monitor 106 can further be coupled to an indicator device 170 that is enabled under particular circumstances described further below.

Conductors 114, 116, 118, and 120 are conductive wires or traces, for example, that conduct power from the power bus 112 to the corresponding device, or from the power supply 108 to the corresponding device. The links 130, 132, 134, 138, and 140 can be wired and/or wireless links for communicating signals, which can be implemented, for example, using one or more of wires or traces. In embodiments, links 130, 132, 134, 138, and 140 can be implemented using optical fibers, near-field communication (NFC) devices, and wireless communication devices. Link 136 can be a communication link via which the signal communicated on link 132 is communicated to the reset monitor 106. The reset monitor 106 can monitor the signal transmitted on link 132 by sensing the reset signal when it is transmitted. In embodiments, the reset monitor 106 can monitor the signal transmitted on link 132 by monitoring a memory location that stores the reset signal transmitted along link 132, wherein monitoring can include, for example, accessing, requesting, polling, and or receiving.

Figure 2:
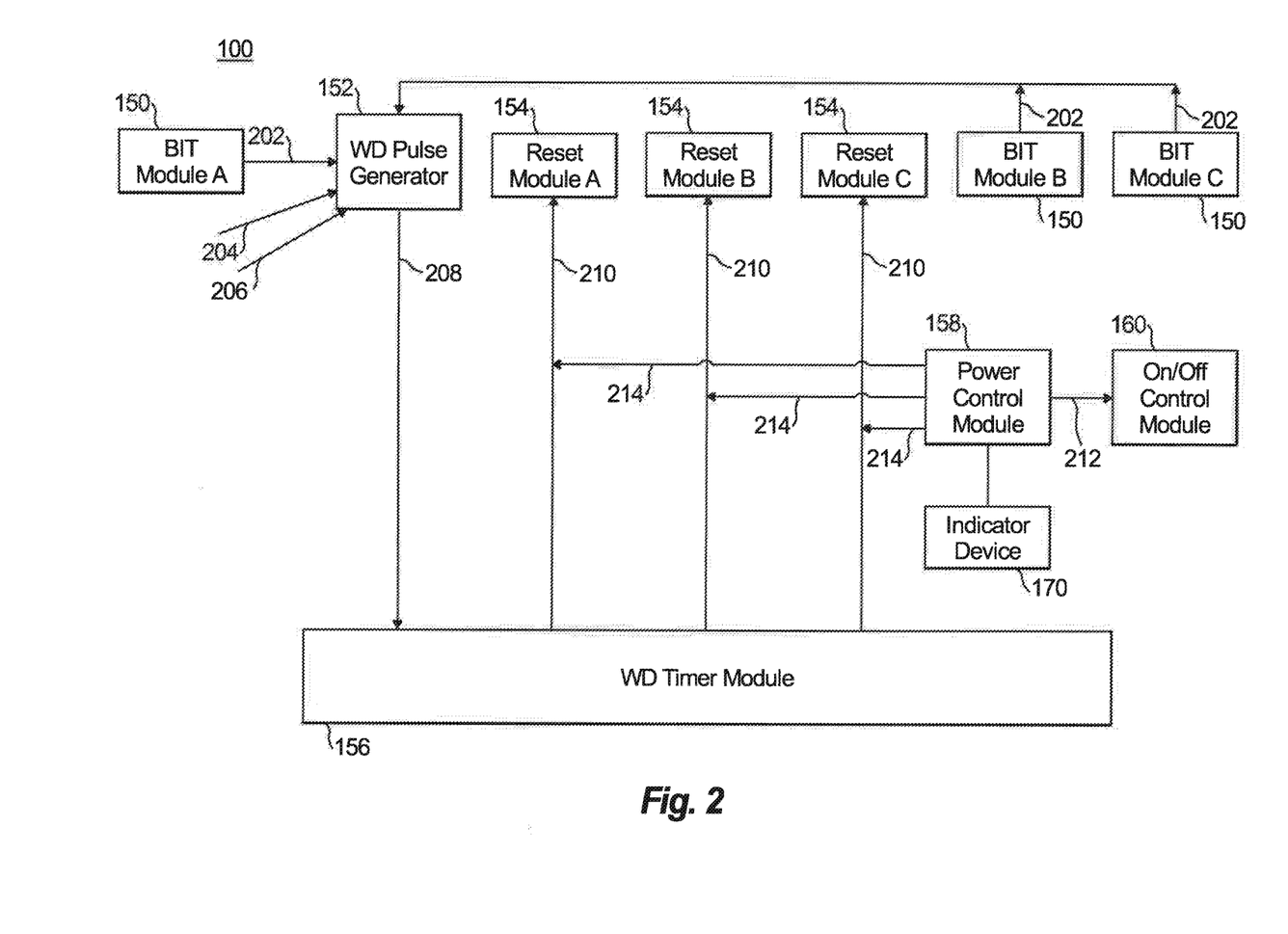
FIG. 2 illustrates a signal flow diagram showing an example of signal flow of the monitor system of FIG. 1.

With additional reference to FIG. 2, a signal flow diagram is shown that illustrates examples of signals exchanged during operation of the monitoring system 100 in accordance with an exemplary method of the disclosure. The microprocessor 102 and/or devices 110 host respective BIT modules 150 that include hardware and/or software to perform diagnostic testing or operational testing of the host device in real time. The BIT modules can output a test result signal 202. The WD pulse generator 152 monitors the various test result signals 202 and determines whether the test result signals 202 satisfy a pass condition. When the pass condition is satisfied, the WD pulse generator 152 outputs WD pulses 130. If the pass condition is not passed (i.e., fails) the WD pulse generator 152 does not output WD pulses 130, causing a reset operation to be triggered by the watchdog device 104. The reset module 154 performs a reset operation by causing a hardware reset of the microprocessor 102 and devices 110 without performing a power restart operation (that entails removing power).

In embodiments, satisfaction of the pass condition can also depend on hardware (HW) signals 204 from hardware components (e.g., memory, bus, I/O interface) included in the microprocessor 102, and request signals 206 from a user or another processing device. The HW signals can indicate a physical or functional status of the corresponding hardware component. The request signals can include a user request to perform a reset operation, a power restart operation, or a power shutdown operation be applied to the microprocessor 102 and devices 110.

The WD timer module 156 monitors the WD pulses 130 output by the WD pulse generator 152, expecting the WD pulses 130 to arrive within a specific time window. When the WD pulses 130 do not arrive when expected, the WD timer module 156 of the watchdog device 104 outputs a reset signal 210 as one or more pulses, and transmits the pulsed reset signal 210 to the reset modules 154 of the microprocessor 102 and the respective devices 110. The reset signal 210 transmitted to each of the microprocessor 102 and the respective devices 110 can be configured in accordance with the specifications of each respective device, such as by configuring, for example, the timing, sequence, width, and magnitude of pulses included in the reset signals. Each reset module 154, configured as a hardware or firmware device, responds to receipt of the reset signal 210 by performing a hardware reset operation that resets the microprocessor 102 or device 110 in which that reset module 154 is included.

The WD timer module 156 counts the number of times that it sends a reset signal 210 to the respective reset modules 154 to reset the microprocessor 102 and/or the devices 110. When the WD timer module 156 determines that transmission of the reset signal 210 satisfies a first predetermined condition, the WD timer module 156 sets the reset signal 210 to a failsafe state and transmits the reset signal in the failsafe state to the microprocessor 102 and the devices 110. The predetermined condition can include the number of times the watchdog trigger was sent exceeding a predetermined threshold value. In embodiments, the predetermined condition can include the number of times the watchdog trigger was sent exceeding a predetermined threshold value within a predetermined time interval.

In embodiments, when set to the failsafe state, reset signal 210 is persistently enabled, causing the microprocessor 102 and the devices 110 to be repeatedly reset.

The power control module 158 of the reset monitor 106 monitors the reset signal 210 via conductive path 214 for a second predetermined condition that indicates that reset signal 210 is set to a failsafe state. The monitoring can be performed, for example and without limitation, by probing link 132, monitoring an address location that indicates the state of the reset signal 210, by querying the watchdog device 104, or by receiving notification from the watchdog device 104, by receiving a copy of the reset signal 210, e.g., via link 136, etc. In embodiments, the second predetermined condition can be that the reset signal 210 is persistently enabled. The second predetermined condition can be recognized, for example, by determining that enablement of the reset signal 210 persists for at least a second predetermined time interval.

In response to a determination that the reset signal 210 satisfies the second predetermined condition, e.g., indicating that reset signal 210 is set to a failsafe state, a power restart operation is triggered. During the power restart operation, the power control module 158 sends a power control signal 212 to the On/Off control module 160 of the power supply 108 that causes the On/Off control module 160 to remove power from being supplied to the microprocessor 102 and the devices 110. This can be accomplished, for example, by discontinuing supplying power via conductor 114 to the supply bus 112, or in other embodiments, discontinuing supplying power directly to the microprocessor 102 and the devices 110. In embodiments, the On/Off control module 160 can be a switch disposed between the power supply 108 and the supply bus 112.

The power restart operation removes power from the microprocessor 102 and the devices 110 and restores the power following a wait period that provides sufficient time to allow rectification of the malfunction, e.g., by allowing power to decay or capacitance to decouple. A shutdown operation removes power from the microprocessor 102 and the devices 110, but does not restore the power. The duration for removing power can be, for example tens to hundreds of milliseconds, depending on specifications of the microprocessor 102 or device 110.

The On/Off control module 160 can further control the power supply 108 to restore power to the bus 112 or directly to the microprocessor 102 and/or the devices 110. The On/Off control module 160 can cause automatic restoration of power following the wait period to provide sufficient time to allow rectification of the malfunction that was indicated by the WD pulses 208. In other embodiments, restoration of power can be conditional upon a third predetermined condition, such as loss of power by the reset monitor 106, which can be recognized by monitoring the state of the power control signal 212. This loss of power by the reset monitor 106 occurs when the reset monitor 106 is powered by the power supply 108, e.g., via bus 112, and loses power when power is removed from the microprocessor 102 and the devices 110.

The On/Off control module 160 can count a number of times that power is removed from and restored to the microprocessor 102 and the devices 110, and determine whether the number of times exceeds a second predetermined value. If the second predetermined value is exceeded, the On/Off control module 160 can disallow restoration of power to the microprocessor 102 and the devices 110.

Additionally, the On/Off control module 160 can enable an indicator signal that actuates the indicator device 170 to indicate that the number of times counted exceeded a threshold value. Actuation of the indicator device 170 can indicate to maintenance operators that one of the microprocessor 102 or the devices 110 can use maintenance and possible replacement of parts.

The feature of removing and restoring power to the microprocessor 102 and the devices 110 provides an advantage of restoring functionality during operation of the host aircraft that could not be restored via the reset operation. A further advantage includes avoiding maintenance and possible replacement of parts that could have been fixed by removing and restoring power, which would clear a soft error related to software. In addition, when maintenance and possible replacement of parts is needed, a clear indication is provided by the indicator device 170.

Figure 3:
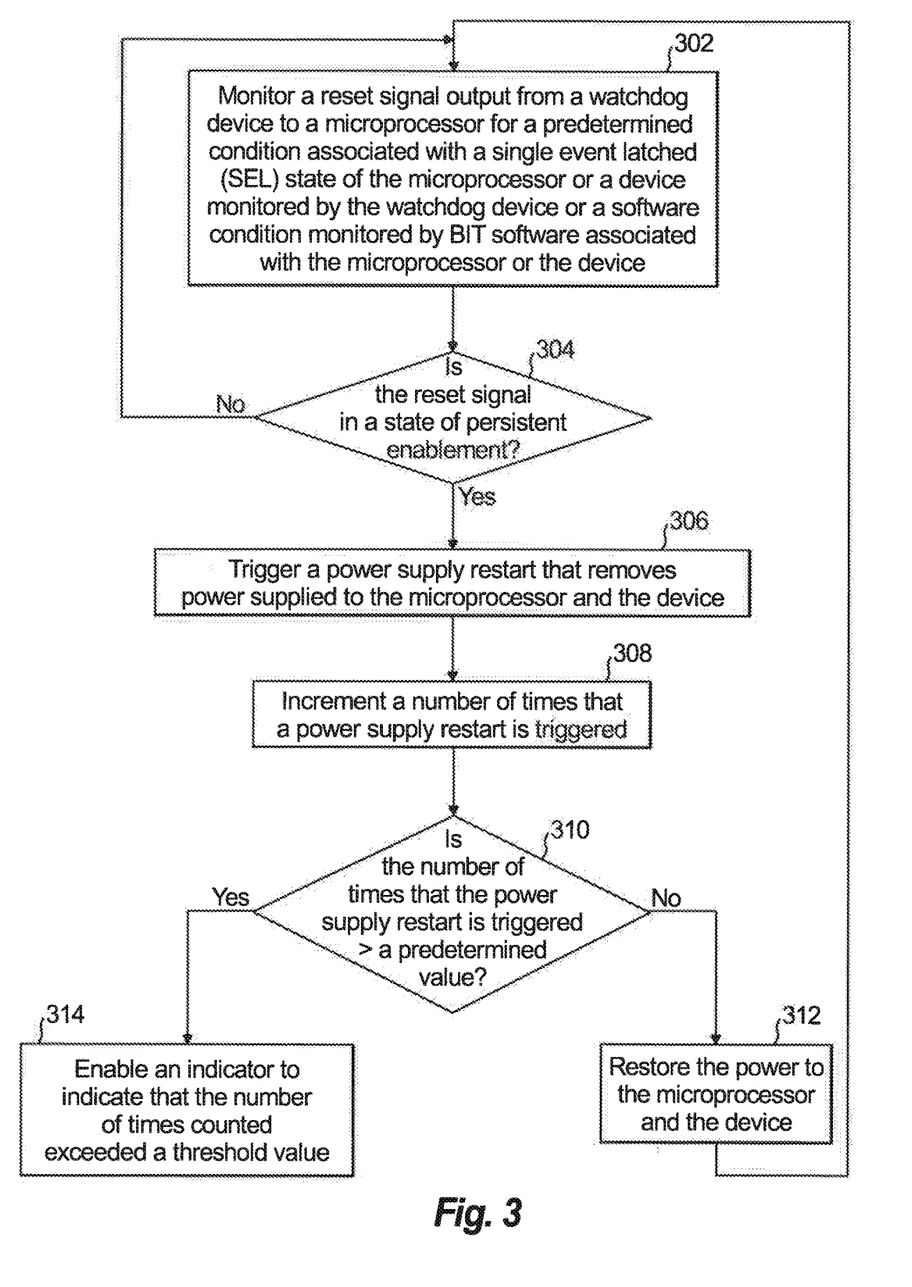
FIG. 3 illustrates a flowchart of an example method of the monitor system of FIG. 2.

With reference now to FIG. 3, shown is a flowchart demonstrating implementation of the various exemplary embodiments.

At operation 302, a reset signal output from a watchdog device to a microprocessor is monitored for a predetermined condition. The predetermined condition is associated with any of a single event latched (SEL) state of the microprocessor monitored by the watchdog device, an SEL state of a device coupled to the microprocessor, or a software or hardware condition monitored by BIT software associated with the microprocessor or the device.

At operation 304, a determination is made whether the reset signal is in a state of persistent enablement. The state of persistent enablement indicates that the reset signal is determined to be associated with the predetermined condition. At operation 306, a power supply restart is triggered that removes power supplied to the microprocessor and the device. At operation 308, a number of times that a power supply restart is triggered is incremented. At operation 310, a determination is made whether the number of times that the power supply restart is triggered exceeds a predetermined value. If the determination at operation 310 is NO, then at operation 312, the power to the microprocessor and the device is restored following a wait period. The wait period is sufficient to allow a malfunction that caused the predetermined condition to be rectified, but restores power as quickly as possible. If the determination at operation 310 is YES, then at operation 314, an optional indicator may be enabled to indicate that the number of times counted exceeded a threshold value or the system may simply be left if the OFF state.

Aspects of the present disclosure are described above with reference to flowchart illustrations and/or block diagrams of methods, apparatus (systems) and computer program products according to embodiments of the disclosure. It will be understood that certain blocks of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

Figure 4:
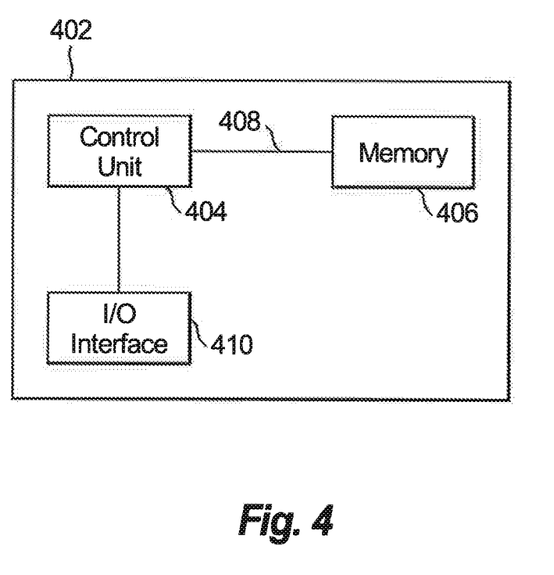
FIG. 4 illustrates internal and external components of a computing system that implements the monitor system of FIG. 1 in accordance with an illustrative embodiment of the present disclosure.

With reference to FIG. 4, the power control module 158 and the On/Off control module 160 (shown in FIGS. 1 and 2) can be configured, for example, as a computer system 402. Computer system 402 is only one example of a suitable system and is not intended to suggest any limitation as to the scope of use or functionality of embodiments of the disclosure described herein. Regardless, computer system 402 is capable of being implemented and/or performing functionality set forth hereinabove.

Computer system 402 is shown in FIG. 4 in the form of a general-purpose computing device. The components of computer system 402 may include, but are not limited to, one or more processors or control units 404, memory devices 406, and a connector or bus 408 that couples various system components including the memory devices 406 to the control unit 404.

The memory devices 406 can include system memory that include system memory having readable media in the form of volatile memory, such as random access memory (RAM) and/or cache memory. Memory devices 406 may further include other removable/non-removable, volatile/non-volatile computer system storage media, such as for storing program data (e.g., phase values) and/or software modules having programmable instructions that are configured to carry out certain functions of embodiments of the disclosure.

Computer system 402 may also include an Input/Output (I/O) interface 410 for communicating with one or more external devices (not shown), such as a keyboard, a pointing device, a display, and/or another computing device. The built-in test circuit is provided for individual processing devices. Each processing device unit produced that includes the built-in test circuit can be subjected to a controlled injection of jitter to determine a timing margin for that individual device throughout the life of the processing device and in the particular conditions (e.g., temperature) that the processing device is operated. Thus system time margins can be determined for each unit, taking into account various factors that affect system time margins, such as parasitic effects, noise, variations in production, software version being used, etc.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Potential advantages provided by the monitor system 100 include restoration of functionality of a microprocessor when a malfunction occurs that is not rectified by applying a reset operation to the microprocessor but can be rectified by removing and restoring power provided to the microprocessor. In addition, functionality can be restored to one or more devices that are coupled to the microprocessor when a malfunction occurs that can be rectified by removing and restoring power provided to the devices. Furthermore, results of BIT testing by the devices can be used to trigger removal of power to the microprocessor 102 and the devices 110. Additionally, an indication can be provided that a predetermined number of removal and restoration of power did not rectify a malfunction condition, which can be strong indication that maintenance or replacement of components may be needed.

The techniques described herein are exemplary, and should not be construed as implying any particular limitation of the certain illustrated embodiments. It should be understood that various alternatives, combinations, and modifications could be devised by those skilled in the art. For example, operations associated with the processes described herein can be performed in any order, unless otherwise specified or dictated by the operations themselves. The present disclosure is intended to embrace all such alternatives, modifications and variances that fall within the scope of the appended claims.

The terms "comprises" or "comprising" are to be interpreted as specifying the presence of the stated features, integers, operations or components, but not precluding the presence of one or more other features, integers, operations or components or groups thereof.

Although the systems and methods of the subject disclosure have been described with respect to the embodiments disclosed above, those skilled in the art will readily appreciate that changes and modifications may be made thereto without departing from the spirit and scope of the certain illustrated embodiments as defined by the appended claims.

The invention claimed is:

1. A method to manage a single event latched (SEL) condition, the method comprising operations to:
   monitor, for a predetermined condition associated with single event latched (SEL) states, a reset signal output from a watchdog device to a microprocessor, the reset signal being responsive to a malfunction condition associated with the microprocessor;
   control provision of power to the microprocessor in response to detection of the predetermined condition, wherein controlling the provision of power includes triggering a power restart that removes power supplied to the microprocessor, the power being subsequently automatically restored to the microprocessor;
   count a number of times that a power restart is triggered; and
   suppress automatic restoration of the power to the microprocessor in response to the number of times counted exceeding a threshold value.

2. The method of claim 1 wherein the malfunction condition associated with the microprocessor is caused by an SEL condition associated with the microprocessor.

3. The method of claim 1 wherein the predetermined condition is determined based on persistent enablement of the reset signal.

4. The method of claim 1 wherein the malfunction condition associated with the microprocessor is caused by an SEL condition that affects a device that is coupled to the microprocessor, the device being coupled to the microprocessor and receiving power to operate from the power provided.

5. The method of claim 4 wherein controlling the provision of power includes triggering a power restart that removes power supplied to the microprocessor and the device, the power being subsequently automatically restored to the microprocessor and the device.

6. The method of claim 1 further comprising operations to enable an indicator signal to indicate that the number of times counted exceeded a threshold value.

7. A monitor system comprising:
   a computing device configured to:
      monitor, for a predetermined condition associated with single event latched (SEL) states, a reset signal output from a watchdog device to a microprocessor, the reset signal being responsive to a malfunction condition associated with the microprocessor, wherein the malfunction condition associated with the microprocessor is caused by an SEL condition that affects a device that is coupled to the microprocessor, the device being coupled to the microprocessor and receiving power to operate from a power supply;

control provision of power to the microprocessor by the power supply in response to detection of the predetermined condition, wherein controlling the provision of power includes triggering a power restart that removes power supplied to the microprocessor and the device, the power being subsequently automatically restored to the microprocessor and the device;

count a number of times that a power restart is triggered; and suppress automatic restoration of the power to the microprocessor and the device in response to the number of times counted exceeding a threshold value.

8. The monitor system of claim 7 wherein the malfunction condition associated with the microprocessor is caused by an SEL condition associated with the microprocessor.

9. The monitor system of claim 7 wherein the predetermined condition is determined based on persistent enablement of the reset signal.

10. The monitor system of claim 7, further comprising a power supply bus, wherein the power supply provides power to the power supply bus and the microprocessor and device receive power from the power supply via the power supply bus, wherein the power supply is controlled to discontinue providing power to the power supply bus.

11. A power delivery system comprising:

a power supply for supplying power from the power supply to electronic processing circuits susceptible to single event latched (SEL); and a computing device configured to:
monitor, for a predetermined condition associated with SEL states, a reset signal output from a watchdog device to the electronic processing circuits, the reset signal being responsive to a malfunction condition associated with the electronic processing circuits;

control provision of power by the power supply to the electronic processing circuits in response to detection of the predetermined condition, wherein controlling the provision of power includes triggering a power restart that removes power supplied to the electronic processing circuits, the power being subsequently automatically restored to the electronic processing circuits;

count a number of times that a power restart is triggered; and suppress automatic restoration of the power to the electronic processing circuits in response to the number of times counted exceeding a threshold value.

12. The power delivery system of claim 11 wherein the malfunction condition associated with the electronic processing circuits is caused by an SEL condition associated with the electronic processing circuits.

13. The power delivery system of claim 11 wherein the predetermined condition is determined based on persistent enablement of the reset signal.

14. The power delivery system of claim 11 further comprising a power supply bus, wherein the power supply provides power to the power supply bus and the electronic processing circuits receive power from the power supply via the power supply bus, wherein the computing device controls the power supply to discontinue providing power to the power supply bus.

* * * * *